United States Patent
Singh et al.

(10) Patent No.: US 11,348,944 B2
(45) Date of Patent: May 31, 2022

(54) SEMICONDUCTOR WAFER WITH DEVICES HAVING DIFFERENT TOP LAYER THICKNESSES

(71) Applicant: Taiwan Semiconductor Manufacturing Company Limited, Hsinchu (TW)

(72) Inventors: Gulbagh Singh, Hsinchu (TW); Kuan-Liang Liu, Hsinchu (TW); Wang Po-Jen, Hsinchu (TW); Kun-Tsang Chuang, Hsinchu (TW); Hsin-Chi Chen, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 16/851,345

(22) Filed: Apr. 17, 2020

(65) Prior Publication Data

US 2021/0327902 A1    Oct. 21, 2021

(51) Int. Cl.
*H01L 27/12* (2006.01)
*H01L 21/02* (2006.01)
(Continued)

(52) U.S. Cl.
CPC ...... *H01L 27/1203* (2013.01); *H01L 21/0206* (2013.01); *H01L 21/02532* (2013.01);
(Continued)

(58) Field of Classification Search
CPC ............. H01L 27/1233; H01L 27/1203; H01L 21/76251; H01L 21/76224–76232;
(Continued)

(56) References Cited

U.S. PATENT DOCUMENTS

| 5,234,535 A | 8/1993 | Beyer et al. |
| 6,492,209 B1 * | 12/2002 | Krishnan ................ H01L 21/84 |
| | | 257/E21.703 |

(Continued)

FOREIGN PATENT DOCUMENTS

| JP | 2005-527111 A | 9/2005 |
| JP | 2008-535258 A | 8/2008 |

(Continued)

*Primary Examiner* — Bac H Au
(74) *Attorney, Agent, or Firm* — Foley & Lardner LLP

(57) ABSTRACT

A circuit includes a base silicon layer, a base oxide layer, a first top silicon layer, a second top silicon layer, a first semiconductor device, and a second semiconductor device. The base oxide layer is formed over the base silicon layer. The first top silicon layer is formed over a first region of the base oxide layer and has a first thickness. The second top silicon layer is formed over a second region of the base oxide layer and has a second thickness less than the first thickness. The first semiconductor device is formed over the first top silicon layer and the second semiconductor device is formed over the second top silicon layer. The ability to fabricate a top silicon layers with differing thicknesses can provide a single substrate having devices with different characteristics, such as having both fully depleted and partially depleted devices on a single substrate.

20 Claims, 21 Drawing Sheets

(51) Int. Cl.
*H01L 21/304* (2006.01)
*H01L 21/306* (2006.01)
*H01L 21/3105* (2006.01)
*H01L 21/762* (2006.01)
*H01L 21/84* (2006.01)

(52) U.S. Cl.
CPC ...... *H01L 21/304* (2013.01); *H01L 21/30604* (2013.01); *H01L 21/31053* (2013.01); *H01L 21/76251* (2013.01); *H01L 21/84* (2013.01)

(58) Field of Classification Search
CPC ........... H01L 21/7624; H01L 21/76264; H01L 21/76283; H01L 29/786; H01L 29/78696; H01L 29/0642–0653
See application file for complete search history.

(56) References Cited

U.S. PATENT DOCUMENTS

| | | | |
|---|---|---|---|
| 6,809,381 B2 | 10/2004 | Yoshida | |
| 8,652,887 B2* | 2/2014 | Nguyen | H01L 27/1203 438/153 |
| 10,559,593 B1* | 2/2020 | Metze | H01L 29/78684 |
| 2001/0005030 A1 | 6/2001 | Imai | |
| 2004/0183131 A1* | 9/2004 | Nagano | H01L 27/1203 257/347 |
| 2005/0003599 A1 | 1/2005 | Yeo et al. | |
| 2005/0110088 A1 | 5/2005 | Hofmann et al. | |
| 2006/0006390 A1* | 1/2006 | Hsu | H01L 21/02595 257/72 |
| 2006/0240629 A1 | 10/2006 | Orlowski et al. | |
| 2007/0176235 A1* | 8/2007 | Tsujiuchi | H01L 27/1203 257/347 |
| 2013/0087855 A1* | 4/2013 | Makiyama | H01L 21/76283 257/350 |
| 2015/0179505 A1* | 6/2015 | Stuber | B81C 1/00698 257/506 |
| 2016/0087069 A1* | 3/2016 | Oda | H01L 27/1203 257/77 |
| 2017/0194194 A1* | 7/2017 | Tsai | H01L 21/304 |
| 2017/0323973 A1* | 11/2017 | Clifton | H01L 21/02532 |
| 2019/0057981 A1* | 2/2019 | Fagot | H01L 27/1207 |
| 2020/0075633 A1* | 3/2020 | Liang | H01L 27/1203 |

FOREIGN PATENT DOCUMENTS

| | | |
|---|---|---|
| KR | 100321560 B1 | 1/2002 |
| TW | 200709424 A | 3/2007 |
| TW | 201611250 A | 3/2016 |

* cited by examiner

SEMICONDUCTOR WAFER WITH DEVICES HAVING DIFFERENT TOP LAYER THICKNESSES

BACKGROUND

The present disclosure generally relates to semiconductor devices and methods for fabricating semiconductor devices. In some previous approaches, semiconductor devices on the same wafer may be limited to having the same top layer thickness, and therefore may be limited to having similar characteristics. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
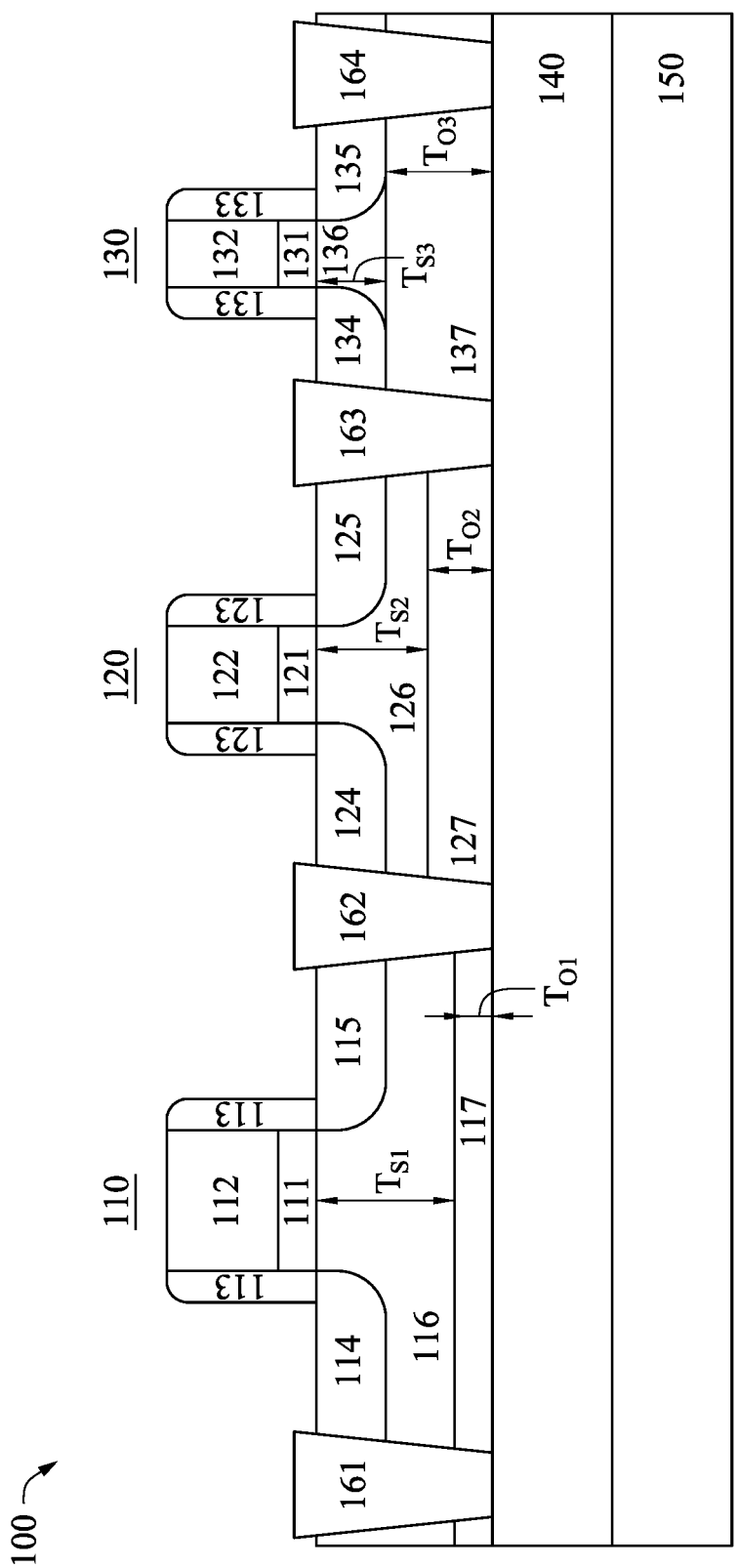
FIG. 1 is a drawing of an example circuit including a plurality of semiconductor devices having different top layer thicknesses, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example circuit 100 includes a plurality of semiconductor devices having different top layer thicknesses, in accordance with some embodiments. Circuit 100 is generally a single substrate (sometimes referred to as a wafer or a chip) that includes multiple semiconductor devices. In some embodiments, the semiconductor devices are metal-oxide semiconductor field-effect transistors (MOSFETs) disposed on a silicon-on-insulator (SOI) substrate structure. The semiconductor devices can be used as multiple-time programmable (MTP) memory devices in a non-volatile memory structure, for example. However, other similar types of materials and devices are also contemplated.

Circuit 100 is shown to include three separate semiconductor devices: a semiconductor device 110, a semiconductor device 120, and a semiconductor device 130. Each of semiconductor device 110, semiconductor device 120, and semiconductor device 130 are formed on a common substrate. Circuit 100 is shown to include a base silicon layer 150 and a buried oxide (BOX) layer 140 formed on a top surface of base silicon layer 150. For example, base silicon layer 150 and BOX layer 140 can be bottom layers of an SOI structure. In some embodiments, base silicon layer 150 is a bulk silicon layer. BOX layer 140 can be formed of silicon dioxide material, for example, and can provide an insulating layer disposed between layers of silicon to reduce parasitic capacitance.

Semiconductor device 110 is shown to include a gate oxide layer 111, a gate 112, a spacer 113, a source 114, and a drain 115. Gate oxide layer 111 is generally a dielectric layer that separates gate 112 from source 114 and drain 115. For example, gate oxide layer 111 can be formed of materials such as silicon nitride, aluminum oxide, silicon dioxide, and other suitable materials. In some embodiments, gate 112 is formed of polysilicon material. However, gate 112 can also be a metal gate. Voltage applied at gate 112 can generally control the operation and conductance of semiconductor device 110. Spacer 113 is formed around gate 112 in order to electrically isolate gate 112 and prevent charge leakage. Spacer 113 can be formed of materials with high dielectric constants such as silicon nitride, silicon oxide, or other suitable materials and combinations thereof. Source 114 and drain 115 are doped regions (e.g. n-type, p-type).

Semiconductor device 110 is also shown to include a top silicon layer 116 and an added oxide layer 117. Top silicon layer 116 is an active layer in contact with source 114, drain 115, and gate oxide layer 111. Added oxide layer 117 is additional oxide material that essentially thickens BOX layer 140 beneath device 110, but not beneath device 120 or device 130. For example, added oxide layer 117 can be additional silicon dioxide material disposed on top of BOX layer 140 to form a larger depletion region.

Similarly, semiconductor device 120 is shown to include a gate oxide layer 121, a gate 122, a spacer 123, a source 124, a drain 125, a top silicon layer 126, and an added oxide layer 127. These structures are similar to gate oxide layer 111, gate 112, spacer 113, source 114, drain 115, top silicon layer 116, and added oxide layer 117 described above.

Further, semiconductor device 130 is shown to include a gate oxide layer 131, a gate 132, a spacer 133, a source 134, a drain 135, a top silicon layer 136, and an added oxide layer 137. These structures are also similar to gate oxide layer 111, gate 112, spacer 113, source 114, drain 115, top silicon layer 116, and added oxide layer 117 described above.

Circuit 100 is also shown to include a plurality of isolation structures 161, 162, 163, and 164. These isolation structures can be formed between devices to prevent crosstalk and other unwanted phenomena. Isolation structures 161, 162, 163, and 164 can be formed of a dielectric material such as silicon oxide, silicon nitride, and other suitable materials and combinations of materials. The height of isolation structures 161, 162, 163, and 164 may vary depending on the thickness of the surrounding top silicon layers. For example, the height of isolation structure 162 may depend on $T_{S1}$ and $T_{S2}$ such that the height of isolation structure 162 needs to be greater than both $T_{S1}$ and $T_{S2}$ by at least a threshold amount. Similarly, the height of isolation structure 163 may depend on $T_{S2}$ and $T_{S3}$ such that the height of isolation structure 163 needs to be greater than both $T_{S2}$ and $T_{S3}$ by at least a threshold amount. However, the height and/or other dimensions of any of isolation structures 161, 162, 163, and 164 can also be independent of the surrounding top silicon layers. The variables $T_{S1}$, $T_{S2}$, and $T_{S3}$ are discussed in more detail below.

In some previous SOI structures, the thickness of the top silicon layer (analogous to top silicon layers 116, 126, and 136) and the thickness of the BOX layer (analogous to the sum of the BOX layer 140 and the associated added oxide layer, such as added oxide layer 117) is essentially the same for all devices on the common substrate. However, it may be desirable to provide the ability to fabricate devices with different characteristics on a single substrate. For example, it may be desirable to fabricate both fully depleted and partially depleted semiconductor devices on a single substrate. Thus, it may be desirable to vary the thickness of the top silicon layer and the BOX layer for different devices on the same substrate. Circuit 100 provides an example of such a structure, wherein the thicknesses of top silicon layer 116, top silicon layer 126, and top silicon layer 136 are all different, as discussed in more detail below.

FIG. 1 provides an illustration of various dimensional characteristics of circuit 100 that can be varied to provide semiconductor devices with different properties. For semiconductor device 110, the variable $T_{S1}$ represents the thickness of top silicon layer 116 measured vertically (in a direction perpendicular to the bottom surface of gate 112) and the variable $T_{O1}$ represents the thickness of added oxide layer 117 measured vertically (in a direction perpendicular to the bottom surface of gate 112). For semiconductor device 120, the variable $T_{S2}$ represents the thickness of top silicon layer 126 measured vertically (in a direction perpendicular to the bottom surface of gate 122) and the variable Toa represents the thickness of added oxide layer 127 measured vertically (in a direction perpendicular to the bottom surface of gate 122). Similarly, for semiconductor device 130, the variable $T_{S3}$ represents the thickness of top silicon layer 136 measured vertically (in a direction perpendicular to the bottom surface of gate 132) and the variable Toa represents the thickness of added oxide layer 137 measured vertically (in a direction perpendicular to the bottom surface of gate 132).

The top silicon layer is generally thinner for a fully depleted device than it is for a partially depleted device. For example, in a structure like circuit 100, a fully depleted device will typically have a top silicon layer thickness of about 50-500 angstroms and a partially depleted device will typically have a top silicon layer thickness of about 500-3000 angstroms, however thicknesses outside of these ranges can also apply and these ranges can vary depending on the intended application. As shown in FIG. 1, both semiconductor device 110 and semiconductor device 120 are partially depleted devices, whereas semiconductor device 130 is a fully depleted device. Moreover, the combined thickness of BOX layer 140 and added oxide layer 117 (or added oxide layer 127 or added oxide layer 137) typically ranges from about 500-5000 angstroms, however this range can vary and thicknesses outside of this range are also contemplated depending on the intended application. Further, the sums $T_{S1}+T_{O1}$ and $T_{S2}+T_{O2}$ and $T_{S3}+T_{O3}$ are equal or about equal (e.g. within 10%) in some embodiments.

Figure 2A:
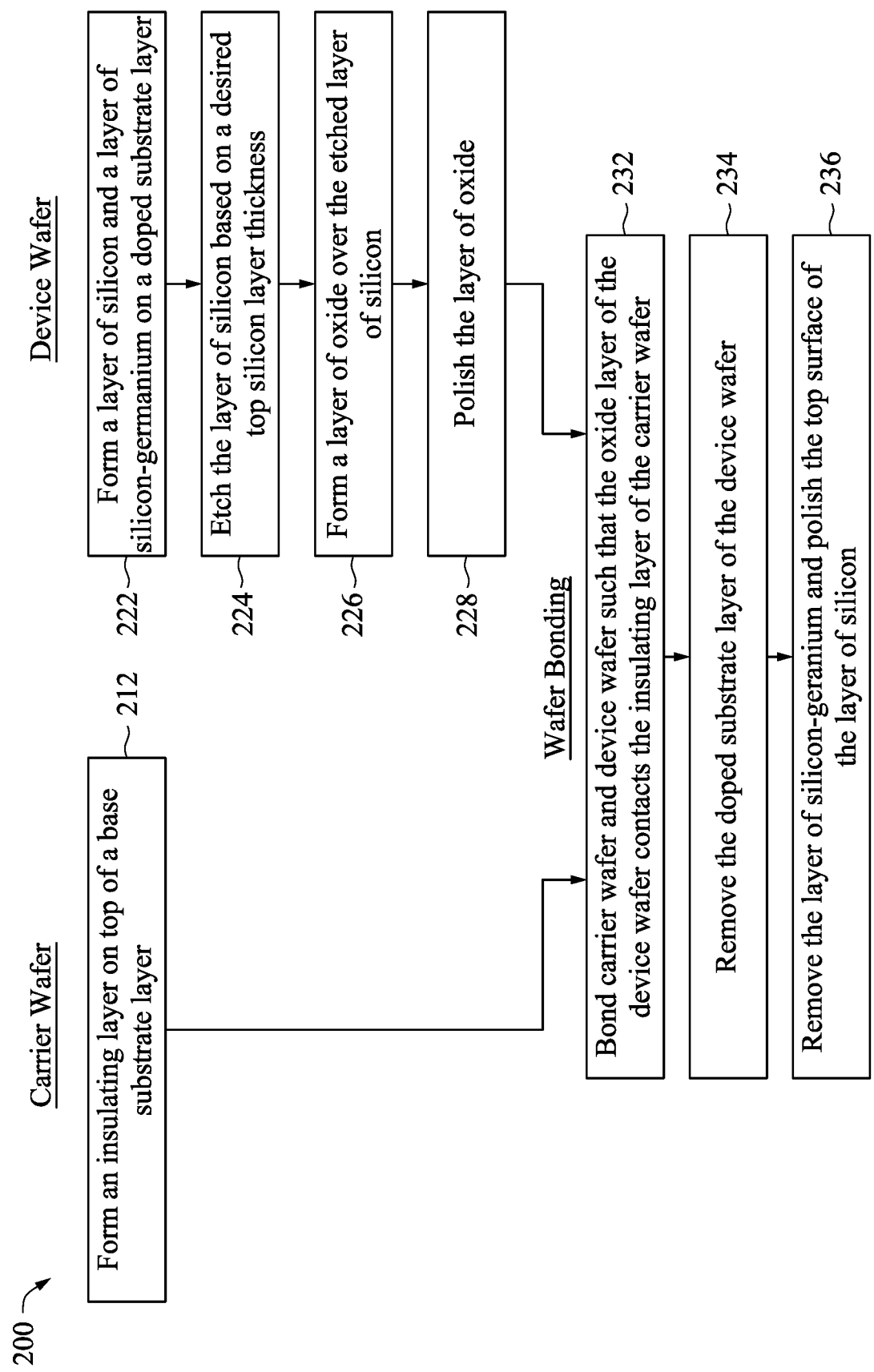
FIG. 2A is a flowchart showing a process for fabricating a semiconductor wafer with devices that have different top layer thicknesses, in accordance with some embodiments.

Referring now to FIG. 2A, a flowchart illustrating a process 200 for fabricating a semiconductor wafer with devices that have different top layer thicknesses is shown, in accordance with some embodiments. FIGS. 2B-2I provide a series of drawings illustrating the steps of process 200, in accordance with some embodiments. Process 200 can be used to produce a circuit structure such as circuit 100, wherein semiconductor devices on the same substrate (e.g. SOI structure) have different top layer thicknesses. For example, some devices on the wafer produced using process 200 can be partially depleted devices and other devices on the wafer can be fully depleted devices.

Figure 2B:
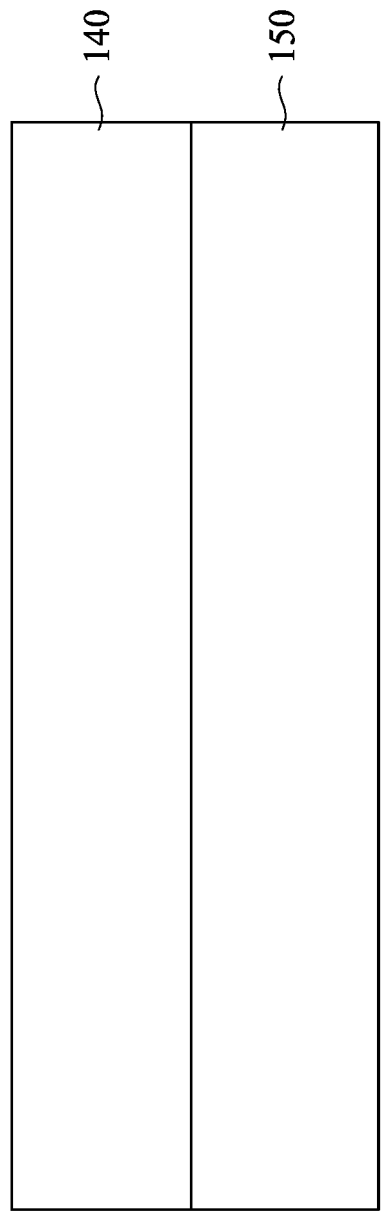
FIGS. 2B-2I are a series of drawings illustrating various steps in the process of FIG. 2A, in accordance with some embodiments.

Process 200 can generally be divided into three sub-processes. First, a carrier wafer is formed; second, a device wafer is formed; and third, the carrier wafer and the device wafer are bonded together. At a step 212, an insulating layer is formed on top of a base substrate layer to from the carrier wafer (FIG. 2B). For example, step 212 can include forming BOX layer 140 on top of base silicon layer 150. However, the insulating layer and the base substrate layer can be formed using a variety of suitable materials. The carrier wafer can generally be large enough to form many semiconductor devices thereon. The insulating layer can be formed on the base substrate layer in a variety of ways, such as by depositing the insulating layer on the base substrate layer or by growing the insulating layer on the base substrate layer.

Figure 2C:
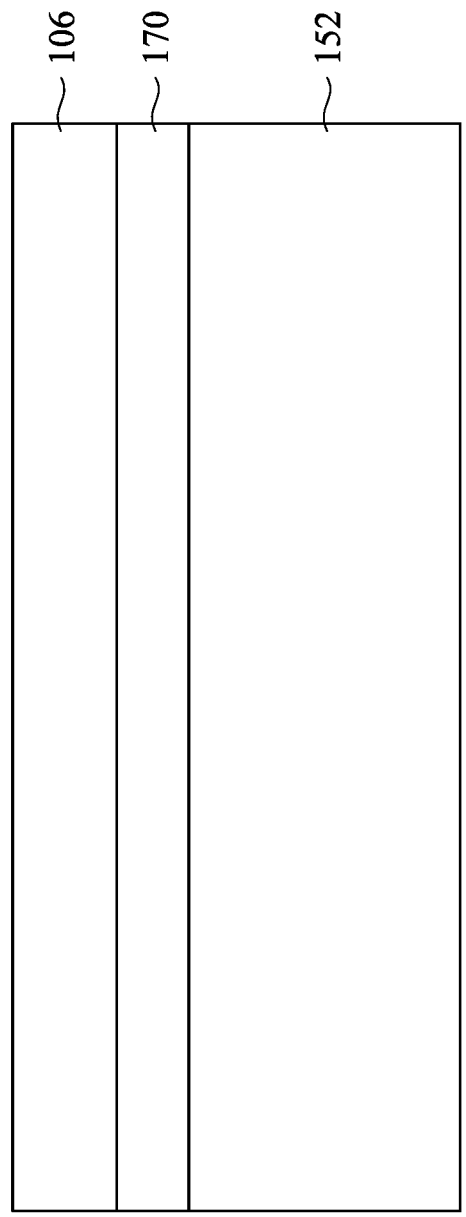

At a step 222, a device wafer is formed by forming a layer of silicon and a layer of silicon-germanium on a doped substrate layer (FIG. 2C). For example, the doped substrate layer can be a bulk silicon substrate layer that is doped with a p-type dopant such as boron to form a P+/P− doped interface within the bulk silicon substrate layer. In some embodiments, the layer of silicon-germanium is formed over the doped substrate layer, and the layer of silicon is formed over the layer of silicon-germanium. In some embodiments, both the layer of silicon-germanium and the layer of silicon are formed on the doped substrate layer using an epitaxial growth process. As shown in FIG. 2C, a layer of silicon-germanium 170 is formed over a dope substrate layer 152, and a layer of silicon 106 is formed over silicon-germanium layer 170.

Figure 2D:
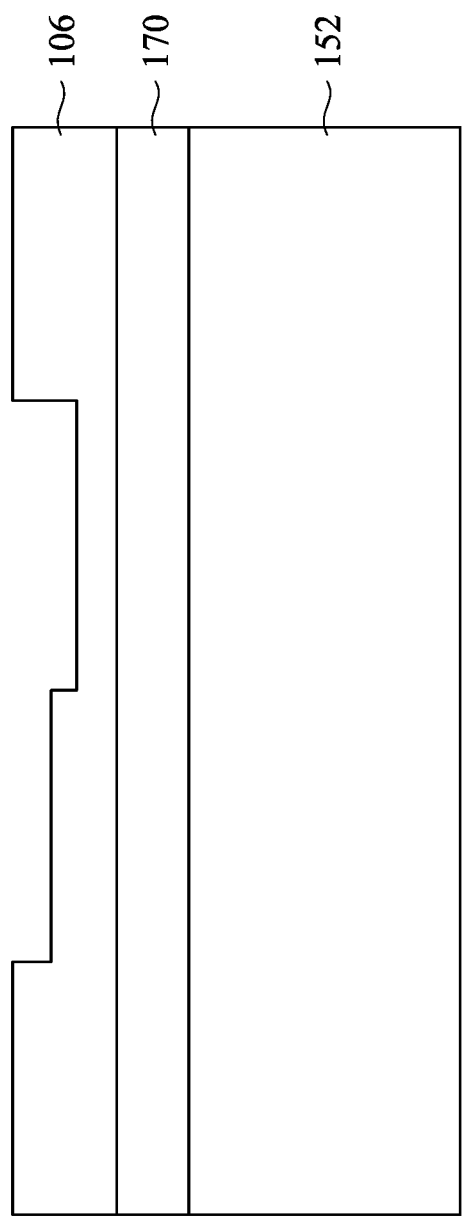

At a step 224, the layer of silicon is etched based on a desired top layer thickness for one or more devices (FIG. 2D). For example, if forming a fully depleted device is desired, step 224 can include etching at least a portion of the layer of silicon down to a thickness of about 50-500 angstroms. However, if a partially depleted device is desired, step 224 can include etching at least a portion of the layer of silicon down to a thickness of about 500-3000 angstroms. Thicknesses outside of these ranges can also apply and these ranges can vary depending on the intended application. The ability to control the thickness of the silicon layer in step 224 can provide the ability to create devices with different top layer thicknesses on the same wafer. As shown in FIG. 2D, silicon layer 106 is etched to different thicknesses in different regions, wherein separate devices are ultimately formed over each of the different regions. The different regions may ultimately become top silicon layer 116 and top silicon layer 126. A partially depleted device with a thicker top silicon layer may be desired due to ease of fabrication or use in memory applications, for example. A fully depleted device with a thinner top silicon layer may be desired for reduced power consumption, for example.

Figure 2E:
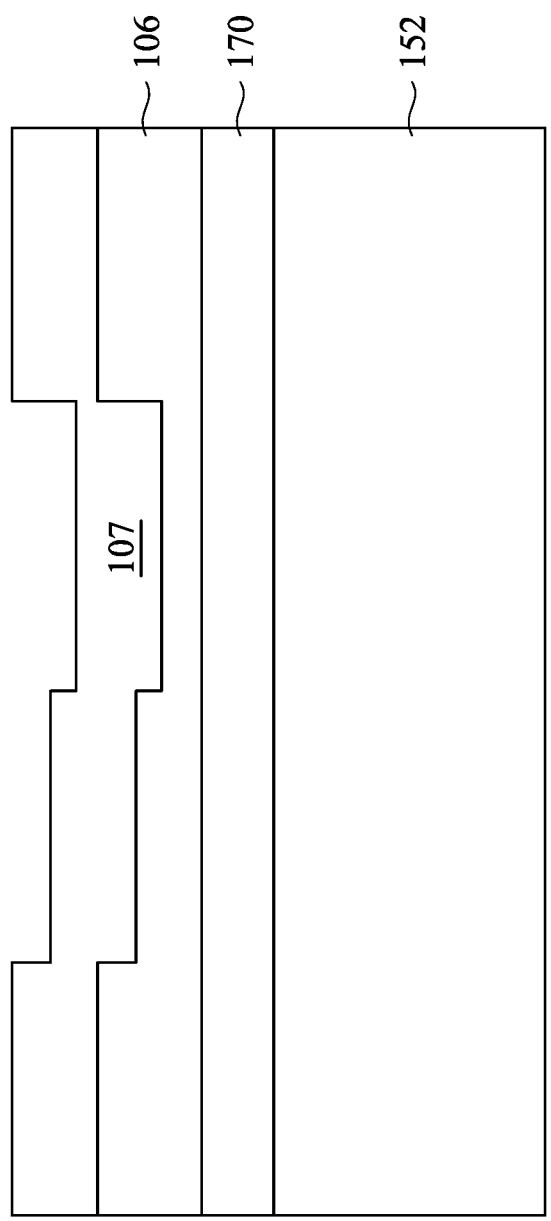

At a step 226, a layer of oxide is formed over the etched layer of silicon (FIG. 2E). For example, step 226 can include forming added oxide layer 117. In some embodiments, the layer of oxide is deposited over the etched layer of silicon in step 226. However, the layer of oxide can be formed over the etched layer of silicon in a variety of ways, including growing the layer of oxide over the etched layer of silicon. As shown in FIG. 2E, a layer of oxide 107 is formed over silicon layer 106.

Figure 2F:
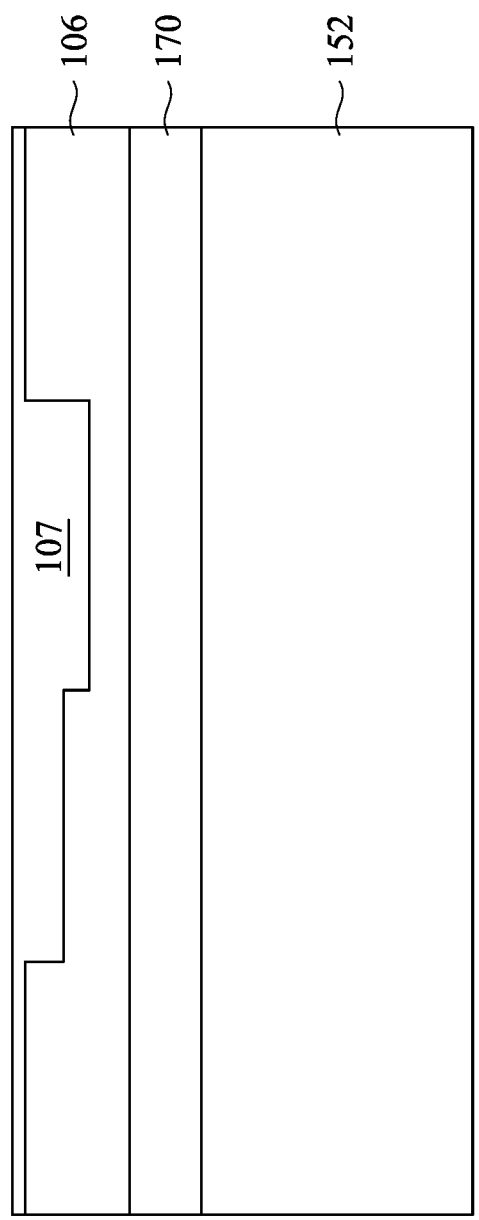

At a step 228, the layer of oxide is polished (FIG. 2F). The oxide layer can be polished in a variety of ways including using a chemical-mechanical polishing (CMP) process, a wet cleaning process, a dry cleaning process, an etching process, and various other suitable ways of polishing the oxide layer and combinations thereof. Step 228 generally involves thinning down the oxide layer in order to create a flat, smooth surface instead of a rough surface that can exist after depositing the oxide layer in step 226. As shown in FIG. 2F, after the polishing in step 228 is performed, oxide layer 107 has different thicknesses at different regions in accordance with the thickness of silicon layer 106 below it. This structure is consistent with the structure described above with respect to circuit 100, wherein the sums $T_{S1}+T_{O1}$ and $T_{S2}+T_{O2}$, for example, are equal or about equal. Moreover, as shown in FIG. 2F, oxide layer 107 has an exposed flat surface for bonding to the carrier wafer.

Figure 2G:
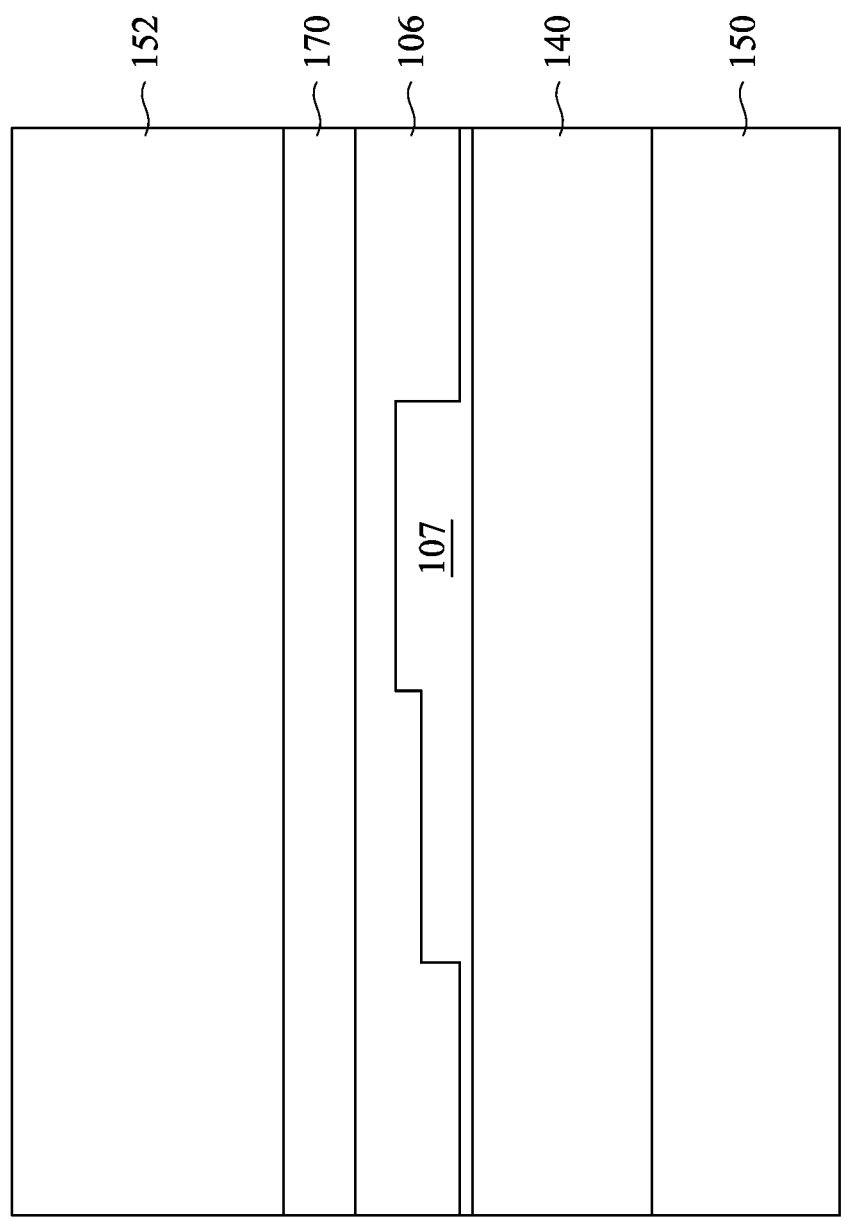

After step 228 is complete, formation of the device wafer is complete, and process 200 continues to the wafer bonding phase. At a step 232, the carrier wafer and the device wafer are bonded together such that the oxide layer of the device wafer contacts the insulating layer of the carrier wafer (FIG. 2G). For example, the device wafer can be bonded to the carrier wafer such that added oxide layer 117 is in contact with BOX layer 140. As discussed, added oxide layer 117 and BOX layer 140 can be formed of the same or similar material, such as silicon dioxide. Multiple different device wafers can be bonded to the carrier wafer in the manner to ultimately provide a wafer with many devices that have different top layer thicknesses. As shown in FIG. 2G, after the bonding in step 228 is performed, oxide layer 107 is in contact with BOX layer 140.

Figure 2H:
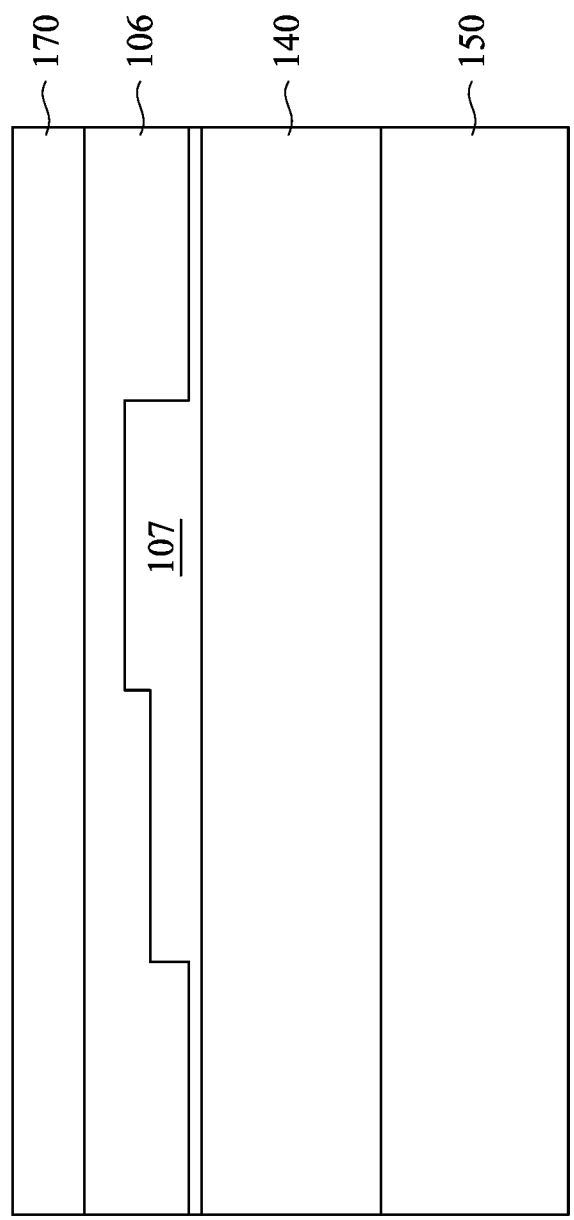

At a step 234, the doped substrate layer of the device wafer is removed (FIG. 2H). Step 234 can be performed in different ways such as by grinding the doped substrate layer, using a hydrofluoric acid, nitric acid, and acetic acid (HNA) mixture to etch the doped substrate layer, and other suitable processes. The grinding process and/or the HNA process can be used to thin the doped substrate layer down to the doped region, such as down to a P+/P− interface. That is, the grinding process and/or the HNA process can be used to partially remove the doped substrate layer of the device wafer. Step 234 can then also include polishing the remaining material from the doped substrate layer, for example by using a CMP process and/or a wet etching process to expose the underlying silicon-germanium layer. Since the doped substrate layer has been treated using an ion implantation process, it can be easier to remove and/or cleaner to remove than a similar substrate layer that has not previously been doped. As shown in FIG. 2H, doped substrate layer 152 is removed.

Figure 2I:
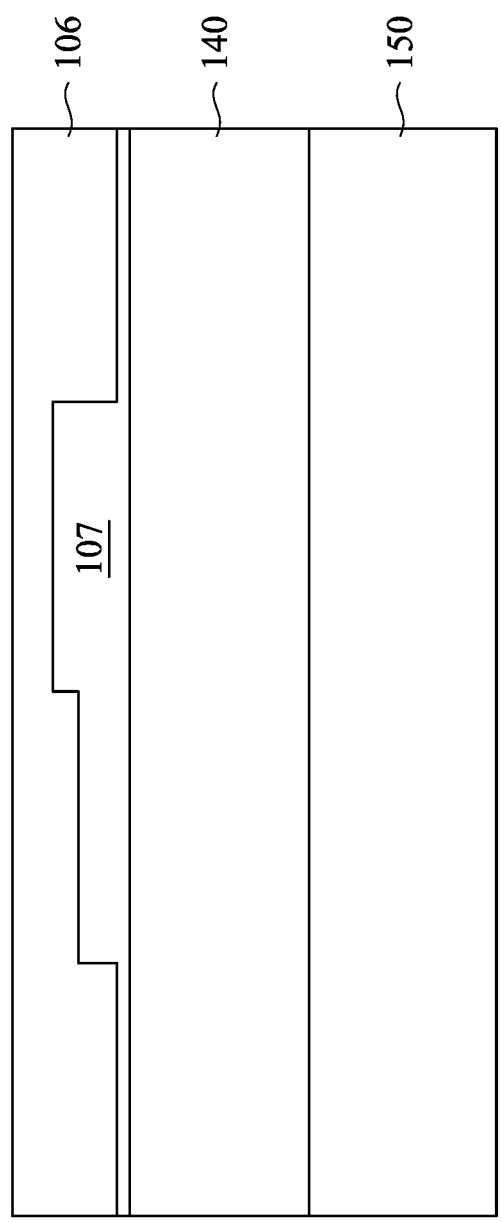

At a step 236, the layer of silicon-germanium is removed and the top surface of the layer of silicon is polished (FIG. 2I). In some embodiments, the layer of silicon-germanium is removed using a wet etching process. Further, the top surface of the layer of silicon can be polished using a wet cleaning process and/or a thermal cleaning process. After step 236 is performed, semiconductor device structure(s) can be formed on the remaining structure. For example, a shallow trench isolation (STI) process can be performed to create structures such as isolation structures 161, 162, 163, and 164. Further, structures such as gate oxide layer 111, gate 112, spacer 113, source 114, and drain 115 can be formed over the polished layer of silicon. Additionally, the layer of silicon can be doped and silicide can be deposited to form conductive electrode terminals over gate 112, source 114, and drain 115. As shown in FIG. 2I, silicon-germanium layer 170 is removed.

Figure 3A:
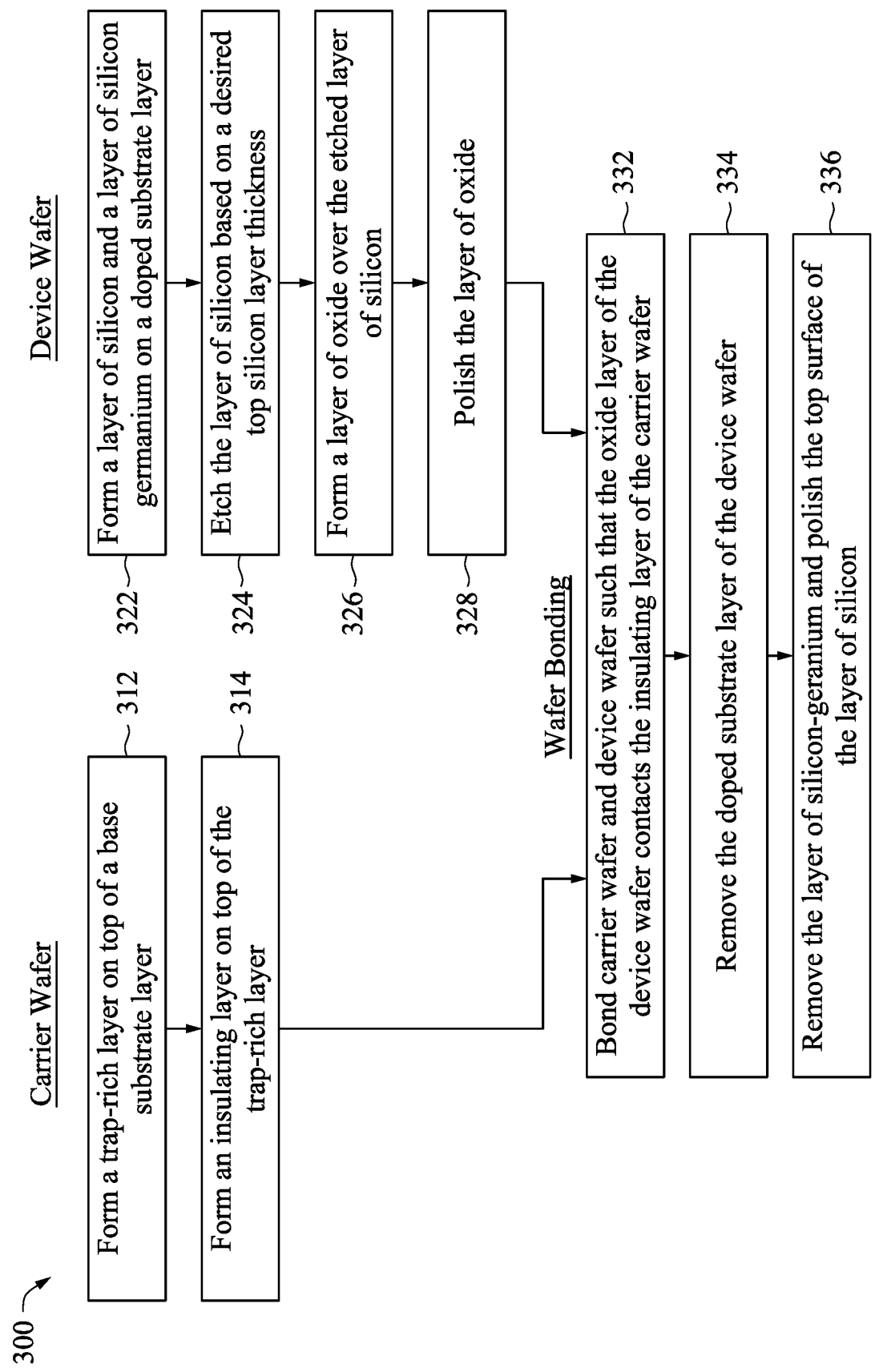
FIG. 3A is a flowchart showing another process for fabricating a semiconductor wafer with devices that have different top layer thicknesses, in accordance with some embodiments.
Figure 3B:
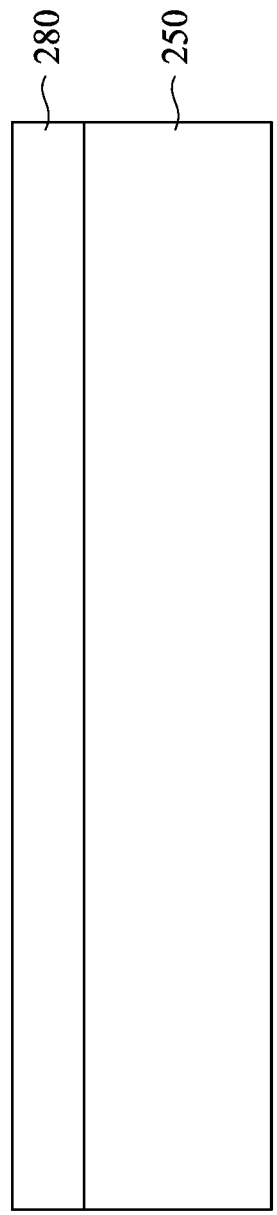
FIGS. 3B-3J are a series of drawings illustrating steps in the process of FIG. 3A, in accordance with some embodiments.
Figure 3C:
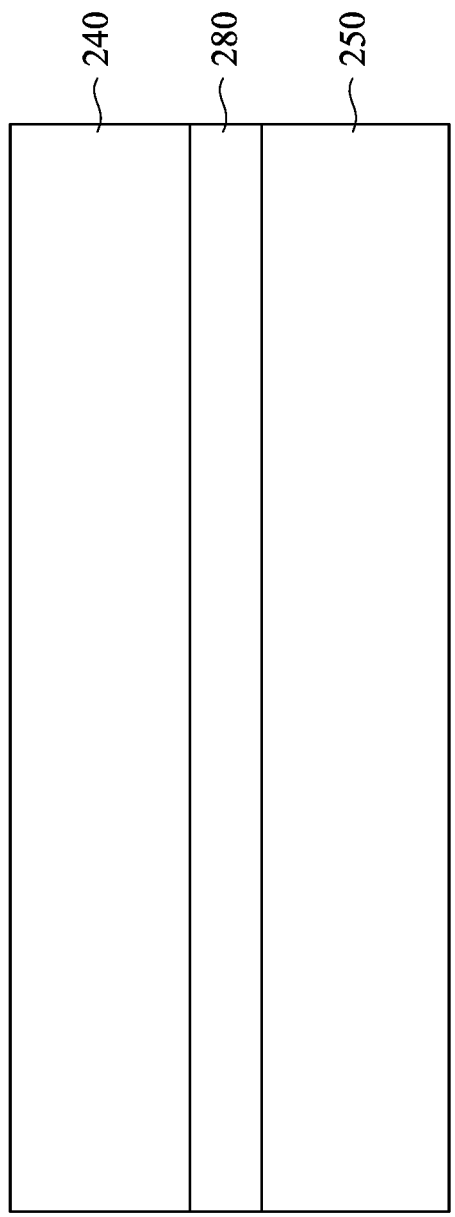
Figure 3D:
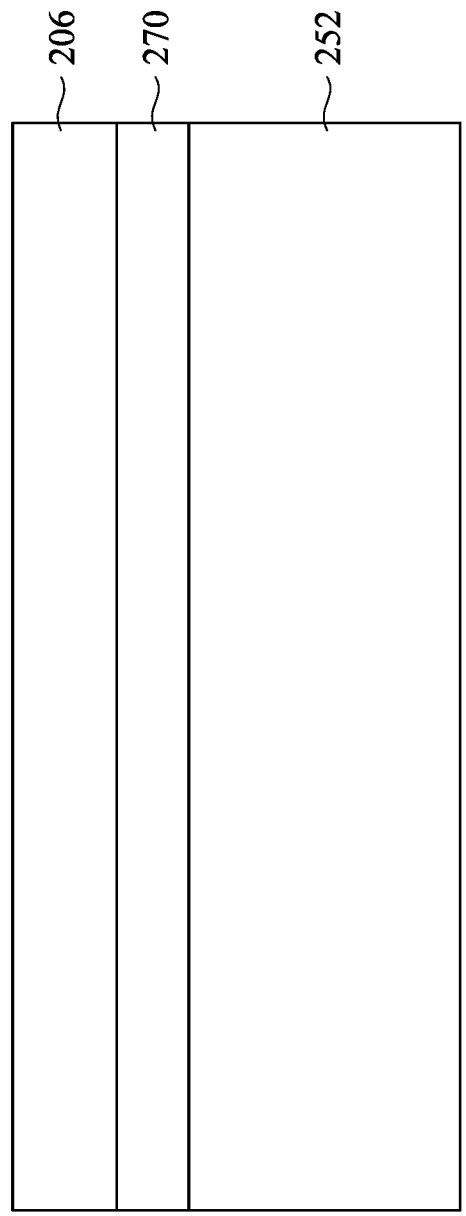

Referring now to FIG. 3A, a flowchart illustrating a process 300 for fabricating a semiconductor wafer with devices that have different top layer thicknesses is shown, in accordance with some embodiments. FIGS. 3B-3J provide a series of drawings illustrating the steps of process 300, in accordance with some embodiments. Process 300 can be used to produce a circuit structure such as circuit 100, wherein semiconductor devices on the same substrate (e.g. SOI structure) have different top layer thicknesses. For example, some devices on the wafer produced using process 300 can be partially depleted devices and other devices on the wafer can be fully depleted devices. Process 300 also includes forming a trap-rich layer within the carrier wafer.

Process 300 can generally be divided into three sub-processes. First, a carrier wafer is formed; second, a device wafer is formed; and third, the carrier wafer and the device wafer are bonded together. At a step 312, a trap-rich layer is formed on top of a base substrate layer (base substrate layer 250 and trap-rich layer 280 in FIG. 3B). At a step 314, an insulating layer is formed on top of the trap-rich layer to form the carrier wafer (insulating layer 240 in FIG. 3C). The trap-rich layer can be formed between BOX layer 140 and base silicon layer 150, for example. The trap-rich layer can lower the effective resistivity of the carrier wafer structure by trapping charge such as positive surface charge. The trap-rich layer can be formed of crystallized silicon, for example, among other suitable materials.

Figure 3E:
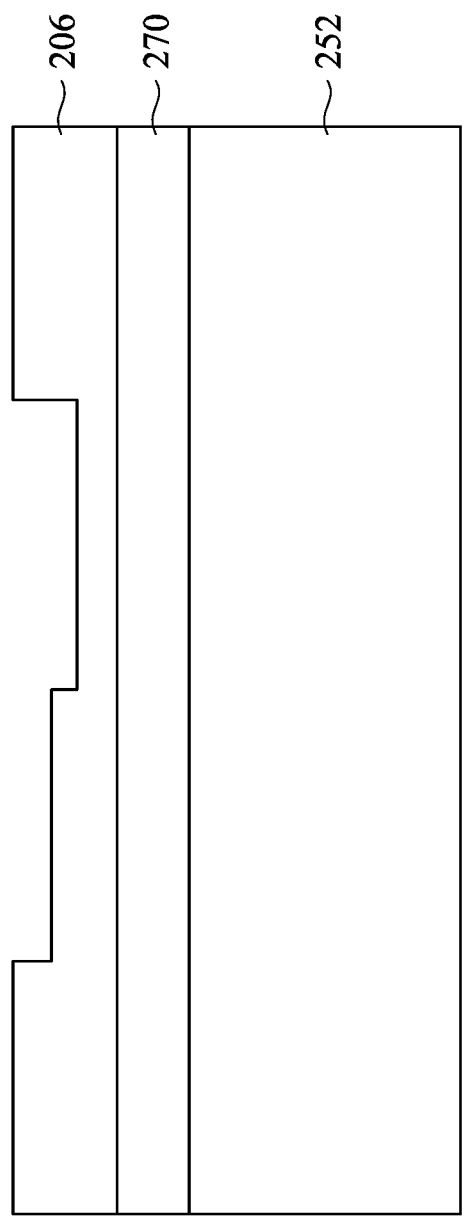
Figure 3F:
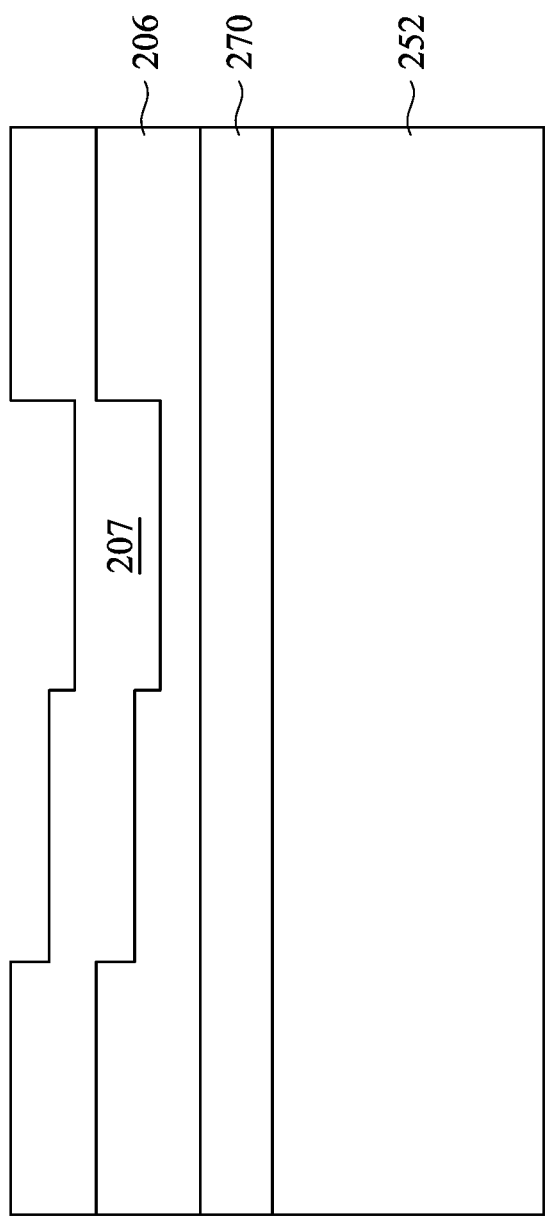
Figure 3G:
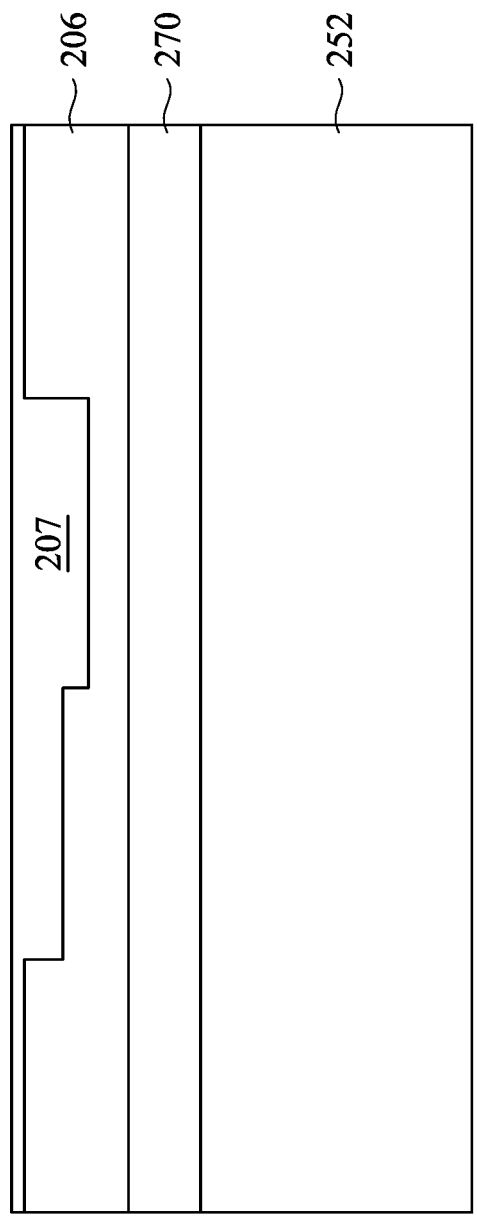
Figure 3H:
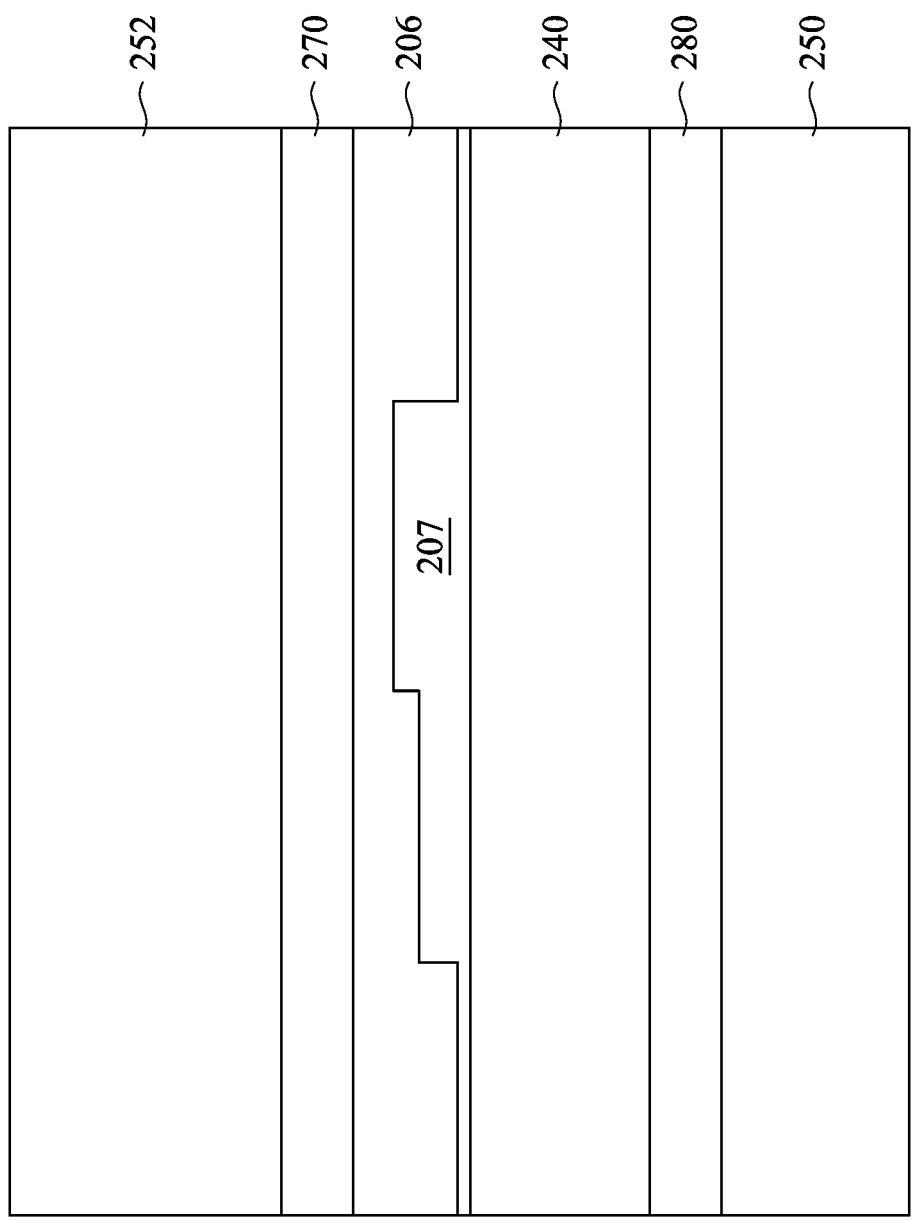
Figure 3I:
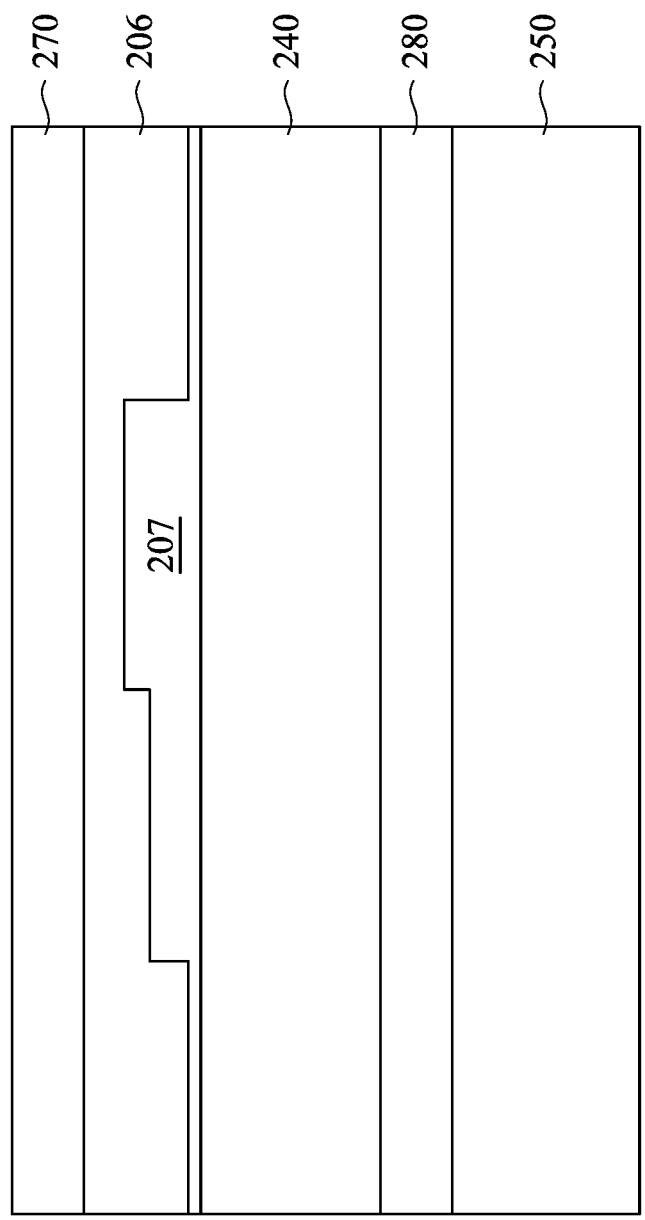
Figure 3J:
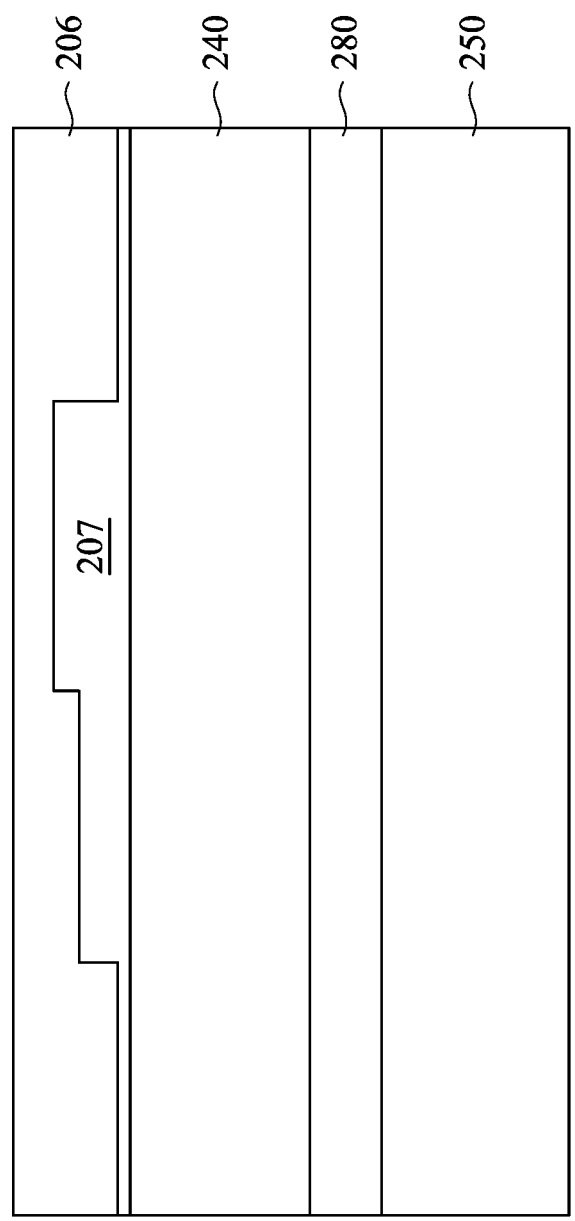

The steps involving formation of the device wafer and bonding of the device wafer to the carrier wafer in process 300 are similar to those of process 200 described above. At a step 322, a device wafer is formed by forming a layer of silicon and a layer of silicon-germanium on a doped substrate layer (doped substrate layer 252, silicon-germanium layer 270, and silicon layer 206 in FIG. 3D). At a step 324, the layer of silicon is etched based on a desired top layer thickness for one or more devices (FIG. 3E). At a step 326, a layer of oxide is formed over the etched layer of silicon (oxide layer 207 in FIG. 3F). At a step 328, the layer of oxide is polished (FIG. 3G). At a step 332, the carrier wafer and the device wafer are bonded such that the oxide layer of the device wafer contacts the insulating layer of the carrier wafer (FIG. 3H). At a step 334, the doped substrate layer of the device wafer is removed (FIG. 3I). At a step 336, the layer of silicon-germanium is removed and the top surface of the layer of silicon is polished (FIG. 3J).

Figure 4:
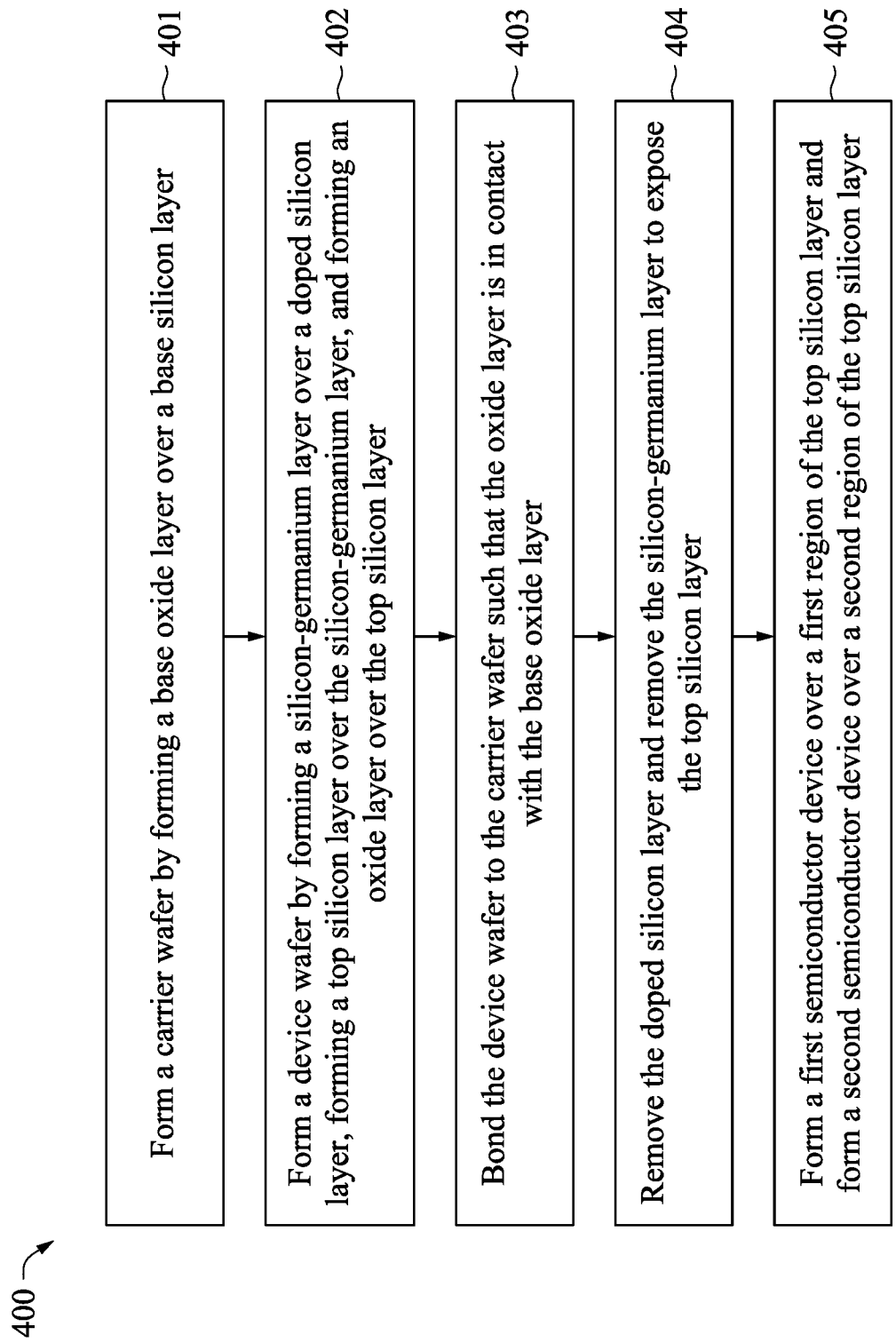
FIG. 4 is a flowchart showing yet another process for fabricating a semiconductor wafer with devices that have different top layer thicknesses, in accordance with some embodiments.

Referring now to FIG. 4, a flowchart illustrating a process 400 for fabricating a semiconductor wafer with devices that have different top layer thicknesses is shown, in accordance with some embodiments. Process 400 can be used to produce a circuit structure such as circuit 100, wherein semiconductor devices on the same substrate (e.g. SOI substrate) have different top layer thicknesses. For example, some devices on the wafer produced using process 400 can be partially depleted devices and other devices on the wafer can be fully depleted devices.

Process 400 is shown to include forming a carrier wafer by forming a base oxide layer over a base silicon layer (step 401). For example, step 401 can include forming BOX layer 140 over base silicon layer 150. In some embodiments, a trap-rich layer is formed between the base oxide layer and the base silicon layer to trap charge and lower the effective resistivity of the carrier wafer structure.

Process 400 is also shown to include forming a device wafer by forming a silicon-germanium layer over a doped silicon layer, forming a top silicon layer over the silicon-germanium layer, and forming an oxide layer over the top silicon layer (step 402). In some embodiments, both the silicon-germanium layer and the top silicon layer are formed over the doped silicon layer using an epitaxial growth process. Moreover, in some embodiments, the top silicon layer is etched such that different regions of the top silicon layer have different thicknesses. For example, the top silicon layer can be etched such that it has two or more different regions having different thicknesses. In this sense, different semiconductor devices can be formed over the different regions of top silicon layer such that the devices have different characteristics, but are disposed on the wafer.

Process 400 is also shown to include bonding the device wafer to the carrier wafer such that the oxide layer is in contact with the base oxide layer (step 403). The oxide layer can be polished, for example using a CMP process, before the bonding in step 403 occurs. Multiple device wafers can be bonded to the carrier wafer, or a single device wafer can be bonded to the carrier wafer having different regions of different thicknesses.

Process 400 is also shown to include removing the doped silicon layer and removing the silicon-germanium layer to expose the top silicon layer (step 404). Removing the doped silicon layer can include removing at least a portion of the doped silicon layer using a grinding process and/or using an HNA mixture. Removing the silicon-germanium layer can include removing the silicon-germanium layer using a wet etching process. After exposing the top silicon layer, the top silicon layer can be polished, for example using a wet cleaning process or a thermal cleaning process.

Process 400 is also shown to include forming a first semiconductor device over a first region of the top silicon layer and forming a second semiconductor device over a second region of the top silicon layer (step 405). For example, the regions can be different regions of the top silicon layer that have different thicknesses as discussed above. In this sense, different semiconductor devices can be formed over the different regions of top silicon layer such that the devices have different characteristics, but are disposed on the same wafer. For example, the first region of the top silicon layer can have a thickness between 500 and 3000 angstroms and the second region of the top silicon layer can have a thickness between 50 and 500 angstroms. Thicknesses outside of these ranges can also apply and these ranges can vary depending on the intended application. In this example, the first semiconductor device is a partially depleted device and the second semiconductor device is a fully depleted device.

The approaches described herein can provide a single semiconductor wafer with devices that have different top layer thicknesses. This structure can provide advantages in that all of semiconductor devices do not have to have the same or nearly the same characteristics. For example, both fully depleted and partially depleted devices can be formed on a single wafer. This structure and the processes described herein to fabricate the structure can be utilized in a variety of ways depending on the intended application.

An implementation of the present disclosure is a circuit. The circuit includes a base silicon layer, a base oxide layer, a first top silicon layer, a second top silicon layer, a first semiconductor device, and a second semiconductor device. The base oxide layer is formed over the base silicon layer. The first top silicon layer is formed over a first region of the base oxide layer and has a first thickness. The second top silicon layer is formed over a second region of the base oxide layer and has a second thickness that is less than the first thickness. The first semiconductor device is formed over the first top silicon layer and the second semiconductor device is formed over the second top silicon layer.

Another implementation of the present disclosure is a method of fabricating a circuit. The method includes forming a carrier wafer by forming a base oxide layer over a base silicon layer. The method further includes forming a first device wafer by forming a first top silicon layer having a first thickness over a first doped silicon layer and forming a first oxide layer over the first top silicon layer, and bonding the first device wafer to a first region of the carrier wafer such that the first oxide layer is in contact with the base oxide layer. The method further includes forming a second device wafer by forming a second top silicon layer having a second thickness less than the first thickness over a second doped silicon layer and forming a second oxide layer over the second top silicon layer, and bonding the second device wafer to a second region of the carrier wafer such that the second oxide layer is in contact with the base oxide layer. The method further includes removing the first doped silicon layer and removing the second doped silicon layer to expose the first top silicon layer and the second top silicon layer and forming a first semiconductor device over the first top silicon layer and forming a second semiconductor device over the second top silicon layer.

Yet another implementation of the present disclosure is another method of fabricating a circuit. The method includes forming a carrier wafer by forming a base oxide layer over a base silicon layer. The method further includes forming a device wafer by forming a silicon-germanium layer over a doped silicon layer, forming a top silicon layer over the silicon-germanium layer, and forming an oxide layer over the top silicon layer. A first region of the top silicon layer has a first thickness and a second region of the top silicon layer has a second thickness different from the first thickness. The method further includes bonding the device wafer to the carrier wafer such that the oxide layer is in contact with the base oxide layer and removing the doped silicon layer and removing the silicon-germanium layer to expose the top silicon layer. The method further includes forming a first semiconductor device over the first region of the top silicon layer and forming a second semiconductor device over the second region of the top silicon layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a circuit device comprising:
   forming a carrier wafer by forming a base oxide layer over a base silicon layer;
   forming a first device wafer by forming a first top silicon layer over a first doped silicon layer and forming a first oxide layer over the first top silicon layer, the first top silicon layer having a first thickness;
   bonding the first device wafer to a first region of the carrier wafer such that the first oxide layer is in contact with the base oxide layer;
   forming a second device wafer by forming a second top silicon layer over a second doped silicon layer and forming a second oxide layer over the second top silicon layer, the second top silicon layer having a second thickness less than the first thickness;
   bonding the second device wafer to a second region of the carrier wafer such that the second oxide layer is in contact with the base oxide layer;
   removing the first doped silicon layer and removing the second doped silicon layer to expose the first top silicon layer and the second top silicon layer;
   forming a first semiconductor device over the first top silicon layer and forming a second semiconductor device over the second top silicon layer; and
   before forming the first top silicon layer over the first doped silicon layer, forming a silicon-germanium layer over the first doped silicon layer, and wherein forming the first top silicon layer over the first doped silicon layer comprises forming the first top silicon layer over the silicon-germanium layer.

2. The method of claim 1, wherein forming the first top silicon layer over the first doped silicon layer comprises forming the first top silicon layer over the first doped silicon layer using an epitaxial growth process.

3. The method of claim 1, further comprising, before forming the first oxide layer over the first top silicon layer, etching the first top silicon layer in accordance with the first thickness.

4. The method of claim 1, further comprising, before forming the first semiconductor device over the first top silicon layer, polishing a top surface of the first top silicon layer using a wet cleaning process or a thermal cleaning process.

5. The method of claim 1, further comprising, before bonding the first device wafer to a first region of the carrier wafer, polishing the first oxide layer using a chemical-mechanical polishing process.

6. The method of claim 1, further comprising, before forming the base oxide layer on the base silicon layer, forming a trap-rich silicon layer over the base oxide layer, wherein forming the base oxide layer on the base silicon layer comprises forming the base oxide layer on the trap-rich silicon layer.

7. The method of claim 1, wherein:
   the first semiconductor device comprises a partially depleted device and the first thickness is between 500 and 3000 angstroms; and
   the second semiconductor device comprises a fully depleted device and the second thickness is between 50 and 500 angstroms.

8. The method of claim 1, wherein the base oxide layer comprises a buried oxide layer formed of silicon dioxide.

9. The method of claim 1, further comprising forming an isolation structure between the first semiconductor device and the second semiconductor device, wherein a height of the isolation structure is greater than the first thickness or the second thickness.

10. The method of claim 1, further comprising forming multiple device wafers including the first device wafer and the second device wafer, and bonding the multiple device wafers to the carrier wafer.

11. A method of fabricating a circuit device comprising:
   forming a carrier wafer by forming a base oxide layer over a base silicon layer;
   forming a device wafer by forming a silicon-germanium layer over a doped silicon layer, forming a top silicon layer over the silicon-germanium layer, and forming an oxide layer over the top silicon layer, wherein a first region of the top silicon layer has a first thickness and a second region of the top silicon layer has a second thickness different from the first thickness;
   bonding the device wafer to the carrier wafer such that the oxide layer is in contact with the base oxide layer;
   removing the doped silicon layer and removing the silicon-germanium layer to expose the top silicon layer; and
   forming a first semiconductor device over the first region of the top silicon layer and forming a second semiconductor device over the second region of the top silicon layer.

12. The method of claim 11, wherein removing the doped silicon layer comprises removing at least a portion of the doped silicon layer using a hydrofluoric acid, nitric acid, and acetic acid mixture.

13. The method of claim 11, wherein removing the silicon-germanium layer comprises removing the silicon-germanium layer using a wet etching process.

14. The method of claim 11, further comprising, before forming the base oxide layer on the base silicon layer, forming a trap-rich silicon layer over the base oxide layer, wherein forming the base oxide layer on the base silicon layer comprises forming the base oxide layer on the trap-rich silicon layer.

15. The method of claim 11, wherein removing the doped silicon layer comprises removing at least a portion of the doped silicon layer using a grinding process.

16. The method of claim 11, further comprising, before forming the semiconductor device over the top silicon layer, polishing a top surface of the top silicon layer using a wet cleaning process or a thermal cleaning process.

17. The method of claim 11, further comprising, before forming the oxide layer over the top silicon layer, etching the first region of the top silicon layer in accordance with the first thickness and etching the second region of the top silicon layer in accordance with the second thickness.

18. The method of claim 11, wherein:
   the first semiconductor device comprises a partially depleted device and the first thickness is between 500 and 3000 angstroms; and the second semiconductor device comprises a fully depleted device and the second thickness is between 50 and 500 angstroms.

19. The method of claim 11, wherein the base oxide layer comprises a buried oxide layer formed of silicon dioxide.

20. The method of claim 11, further comprising forming an isolation structure between the first semiconductor device and the second semiconductor device, wherein a height of the isolation structure is greater than the first thickness or the second thickness.

* * * * *